United States Patent [19]

Ammon et al.

[11] 4,230,385
[45] Oct. 28, 1980

[54] PRINTED CIRCUIT BOARD, ELECTRICAL CONNECTOR AND METHOD OF ASSEMBLY

[75] Inventors: J. Preston Ammon; Harry R. Weaver, both of Dallas, Tex.

[73] Assignee: Elfab Corporation, Dallas, Tex.

[21] Appl. No.: 9,957

[22] Filed: Feb. 6, 1979

Related U.S. Application Data

[63] Continuation of Ser. No. 805,727, Jun. 13, 1977, abandoned.

[51] Int. Cl.³ ............................................. H05K 1/08
[52] U.S. Cl. ................................. 339/17 R; 174/68.5; 339/17 T
[58] Field of Search ................ 339/17 R, 17 C, 17 E, 339/17 T, 96, 116 R, 116 C, 221 R, 221 M, 278 D; 29/625, 626, 627; 174/68.5

[56] References Cited

U.S. PATENT DOCUMENTS

| | | | |
|---|---|---|---|
| 3,268,653 | 8/1966 | McNutt | 339/17 E |
| 3,518,610 | 6/1970 | Goodman et al. | 339/17 |
| 3,660,726 | 5/1972 | Ammon et al. | 339/17 C |

FOREIGN PATENT DOCUMENTS

| | | | |
|---|---|---|---|
| 2303969 | 8/1974 | Fed. Rep. of Germany | 339/221 M |
| 1440894 | 6/1976 | United Kingdom | 339/17 C |

OTHER PUBLICATIONS

IBM Tech. Discl. Bulletin, Troxell, vol. 7, No. 9, Feb. 1965, p. 735.

*Primary Examiner*—Neil Abrams
*Attorney, Agent, or Firm*—Crisman & Moore

[57] ABSTRACT

A solderless electrical connector comprising a printed circuit board and electrical contact terminals mounted therein. A printed circuit board is fabricated to the construction stage wherein conductive circuitry interconnects plated through holes formed therethrough. The exposed circuitry and plated through holes are covered with a conformal coating of insulative material which seals the outer surfaces of the conductive materials from the environment and its effects. The insulative coating obviates the need for solder to protect the conductive materials as well as precludes the use of solder for electrical interconnection therewith. The plated through holes are constructed for press fit insertion of contact terminals in tight frictional engagement therein. The press fit insertion of a contact having an angular edge portion effectively penetrates the insulative coating by deforming it away from that portion of the plated through hole brought to bear against the contact. A mechanical and electrical interconnection is thereby provided between the plated through hole and contact terminal of the press fit assembly while the utilization of solder and the requisite heat thereof is effectively eliminated.

31 Claims, 10 Drawing Figures

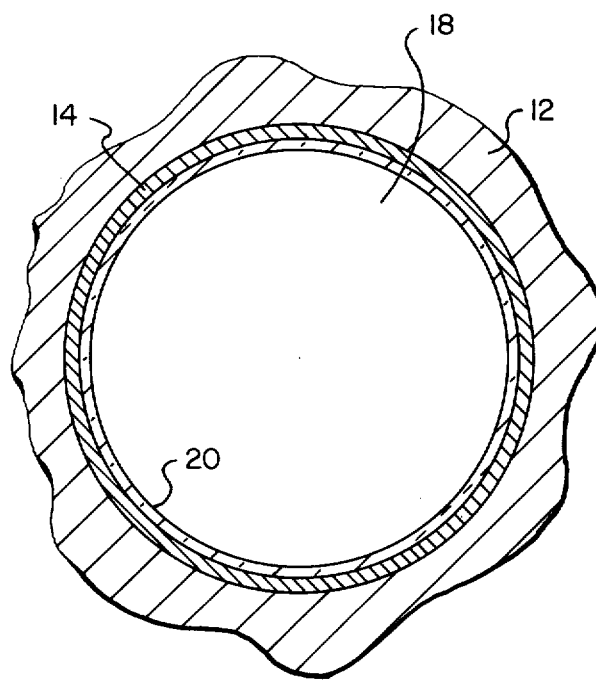
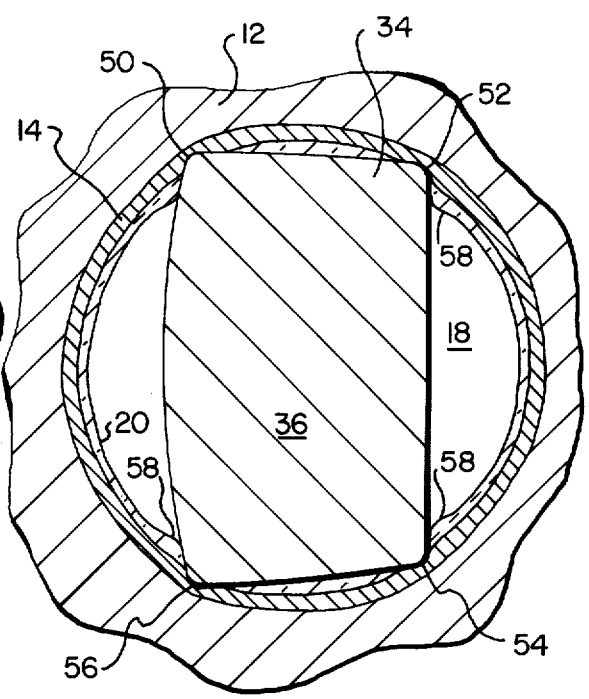
FIG. 6  FIG. 7
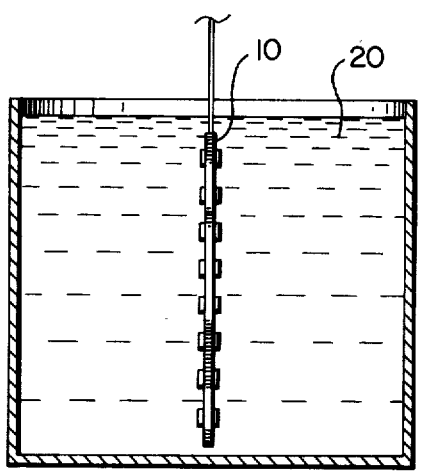
FIG. 8A
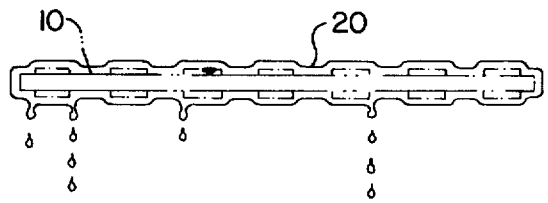
FIG. 8B
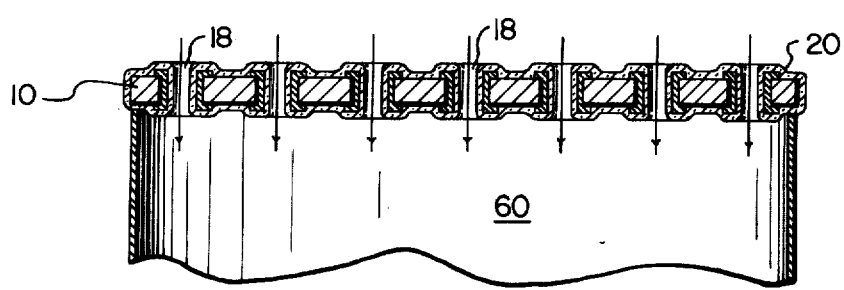
FIG. 8C

PRINTED CIRCUIT BOARD, ELECTRICAL CONNECTOR AND METHOD OF ASSEMBLY

CROSS REFERENCE TO RELATED APPLICATION

This application is a continuation of prior application Ser. No. 805,727, filed June 13, 1977, now abandoned.

BACKGROUND OF THE INVENTION

The invention relates to printed circuit boards and more particularly, to a printed circuit board of an electrical connector having an insulative coating covering the conductive circuitry and the side walls of contact receiving apertures formed therein.

Solder is a tin-lead alloy which has been and is presently, utilized in one respect or another to effect substantially all electrical interconnections upon printed circuit boards. In fact, in certain printed circuit board applications, it is even desirable to coat exposed copper circuitry patterns with solder even when no additional electrical connection is to be made. This fabrication step protects the circuitry from oxidation and other environmental effects and may facilitate subsequent electrical assembly. Although subsequent solder operations are not always necessary for assembly of modern printed circuit boards, the almost universal acceptance of solder in the electrical connector industry has precipitated its continued use. More recently, however, it has been recognized that the prerequisite heat of solder application, as well as certain metallurgical aspects of the alloy itself, may be disadvantageous from a product reliability standpoint. For such reasons, the specific assembly requirements and fabrication techniques of printed circuit boards and connectors have come under close scrutiny.

Certain prior art approaches to printed circuit boards and electrical connector assemblies have included press fitting contacts directly into plated through holes of a mounting substrate to support the contacts and hold them rigidly in a fixed configuration. This press fit approach is in contrast to that of inserting a contact into a plated through hole in a mounting substrate and soldering it therein. Although solder may be present in both instances, in the latter, the reflowed solder is the primary interfacing element of a solid electrical-mechanical interconnection. In the press fit aperture, solder functions in the main, as an environmental coating. Of course the advantages of the press fit assembly are readily recognizable in that it is virtually impossible to remove a contact structurally adhered by solder to the mounting substrate for repair without reheating the solder. The press fitted pin may be pushed out whether or not there is solder in the hole, facilitating the insertion of a new pin into the original hole. The malleable solder lining of the press fit hole is generally displaced or deformed, as is the conductive, plated through lining thereof, during press fitting of the rigid pin therein. Angular edges on the press fit pin are particularly effective in accomplishing this result. In such an assembly it may be seen that the function of the solder in the plated through hole is limited to that of coating and protecting the uncontacted, or exposed, side walls of the hole. Such an assembly, of the card edge connector type, is described in U.S. Pat. No. 3,671,917, issued to John P. Ammon and Frederick T. Inacker on June 20, 1972, and assigned to the assignee of the present invention.

A trend in the state of the art development of the substrate mounted connector is the use of structures which include an insulator removable from around an array of contacts rigidly mounted in a substrate through press fit interengagement. A principal reason for removable layover-insulators is repairability. In certain instances the removable insulator may even serve as the initial contact holding fixture and press fitting tool. The resulting printed circuit board connector can therein be assembled from independent, prefabricated subassemblies without the application of solder or the heat therefrom. The only solder which may be present on the assembly is that which is applied to the printed circuit board in its fabrication stage as a coating for the circuitry on the board and in the contact receiving apertures. Such an assembly is shown and described in U.S. Pat. No. 4,045,868 issued Sept. 6, 1977 to Preston Ammon, et al, and assigned to the assignee of the present invention.

In certain prior art structures, the application of the solder coating to substantial portions of the circuitry pattern of the printed circuit board has, in itself, been eliminated. Coating substitutes have, in such structures, been comprised of epoxies and related dielectric copolymers which may be applied in a liquid state and allowed to harden into a sealed encapsulation surface. Often the coating is applied by a silkscreen process, allowing selectivity in pattern applications. The coating is, however, specifically not applied to the circuitry in and around the plated through holes of the printed circuit board before the contacts are inserted since the coating is insulative. These regions of electrical interconnection are again coated with conductive molten solder as in previous applications. For this reason, the coating of insulative epoxy in this selective configuration is commonly referred to as a solder mask. The utility and effectiveness of a solder mask are most clearly manifested when the contact receiving apertures are press fitted with contact terminals. In this manner the printed circuit board is not subjected to the heat of soldering for securing the contacts therein. The portions of the printed circuit board in and around the plated through holes comprise the only area thereof coated with solder and therefore the only areas necessitating the application heat. Unfortunately, it is impractical to heat only the region of contact aperture circuitry when applying solder to a printed circuit board with or without a solder mask, and therefore the entire board is exposed to the molten material for anywhere from two to four seconds. The melting point of most tin-lead alloys is 300° C. and such a temperature is, to an established degree, destructive to the board fibers and the assembly thereof. The solder application temperature may thus be seen to be a controlling parameter for selection of most printed circuit board materials and methods of assembly.

It would be an advantage, therefore, to provide a printed circuit board and electrical connector which could be fabricated and assembled without solder and the requisite heat thereof. The apparatus of the present invention is especially adapted for just such a purpose. The printed circuit board is fabricated to the construction stage wherein conductive circuitry interconnects plated through holes found therein. The board is then coated with a dielectric mask which seals substantially all of the outer surfaces of circuitry, including the plated through holes, from the environment. The plated through holes are adapted for receiving contact terminals press fitted therein. The contacts are provided with angular edge portions which effectively penetrate and deform the dielectric mask away from that portion of the plated through hole brought to bear against the contact. The untouched portion of the hole remains coated and sealed from the environment while a rigid electrical and mechanical connection is effected. In this manner, solder is eliminated and the requisite heat thereof may be removed as a design parameter.

SUMMARY OF THE INVENTION

The invention relates to an improved printed circuit board and electrical connector which includes an insulative mounting substrate having plated through holes formed therein and an insulative coating lining the side walls thereof. The printed circuit board of the present invention includes conductive circuitry formed in a pattern thereon and interconnecting certain ones of the plated through holes. The plated through holes are adapted for receiving contact terminals having depending edge portions press fitted in tight frictional engagement therein. The press fitting of the edge portion of the contact in the hole causes penetration of the insulative coating and electrical interconnection between the contact and the conductive side wall of the hole.

In another aspect, the invention includes an electrical connector comprising a mounting substrate having plated through contact receiving apertures formed therein. A pattern of conductive circuitry is formed upon the mounting substrate and extends to certain ones of the contact receiving apertures in electrical engagement therewith. A mask of insulative coating is applied to the exposed surfaces of the conductive circuitry and plated through holes. Contacts are press fitted into the plated through holes, with the contacts having edge portions penetrating and deforming the insulative coating adjacent thereto for effecting an interfering engagement with the plated through holes.

In another aspect, the invention includes an improved side wall construction of a contact receiving aperture of the type comprising a hole in and through an insulative mounting substrate having conductive traces formed thereon. The aperture is plated through with a first layer of conductive material, such as copper, in electrical contact with the conductive trace adjacent the aperture. The aperture itself is adapted for receiving a contact having an angular edge portion in press fit engagement. The improvement comprises a pierceable insulative coating masking the first layer of conductive material lining the aperture. With the conductive material forming a cylindrical coating around the aperture of a diameter less than the largest cross sectional width of the press fit region of the contact, the insertion of the contact pierces the coating and effects electrical engagement with the side walls of the aperture. Such a structural configuration obviates the need for solder as an environmental sealer.

In yet another aspect, the invention includes a method of assembling a substantially solderless electrical connector with a mounting substrate having plated through holes of copper, or the like, masked in an insulative coating. A printed circuit board is fabricated to the construction stage wherein a pattern of conductive circuitry interconnects the conductive material of plated through holes. The printed circuit board is then dipped, sprayed, or otherwise encapsulated with a conformal, dielectric coating of epoxy, or the like, wherein all exposed portions of conductive material on the board and in the holes, are sealed from the environment. The coating is allowed to self level to the desired thickness and then air is drawn through the holes to provide a thin uniform coating therearound and through. Contacts of the press fit variety, having angular edge portions, are inserted into the coated holes. The press fit insertion penetrates and deforms the insulative coating away from that portion of the plated through hole brought to bear against the contact. In this manner, a mechanical and electrical connection is thereby provided between the plated through hole and the contact.

BRIEF DESCRIPTION OF THE DRAWINGS

For a more complete understanding of the present invention and for further objects and advantages thereof, reference may now be had to the following description taken in conjunction with the accompanying drawings, in which:

FIG. 6 is an enlarged, top plan, cross-sectional view of a contact receiving aperture of the printed circuit board of FIG. 3, illustrating a layer of insulative coating therearound;

FIG. 7 is an enlarged, top plan cross-sectional view of the aperture of FIG. 6 with a contact terminal inserted therein and illustrating penetration of the insulative coating therearound for tight fit electrical and mechanical interconnection therebetween; and FIGS. 8A, 8B and 8C are diagrammatical representations of three stages of assembly of a printed circuit board with an insulative coating in accordance with the principles of the present invention.

DETAILED DESCRIPTION

Figure 3:
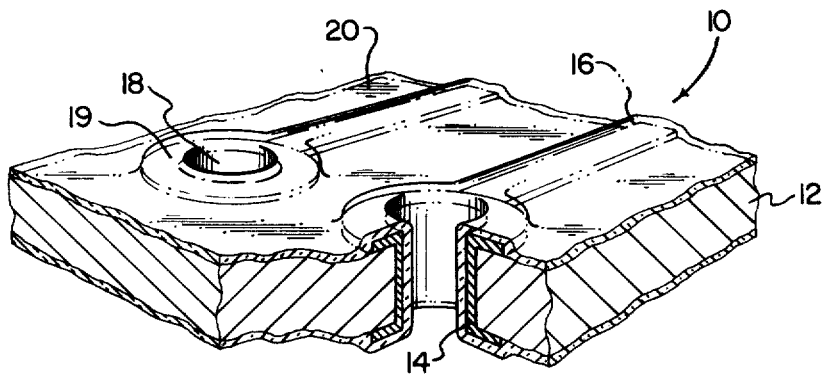
FIG. 3 is a fragmentary perspective view of a printed circuit board having contact receiving apertures formed therein and constructed in accordance with the principles of the present invention wherein an insulative coating is applied thereto.

Referring first to FIG. 3, there is shown a perspective view of one embodiment of a printed circuit board 10 constructed in accordance with the principles of the present invention. The printed circuit board 10 includes an insulative mounting substrate 12 formed of an epoxy resin impregnated fiberglass printed circuit board material such as G-10, or the like, having a pattern of conductive material 14 such as copper, formed thereon. The conductive material 14 may be seen to lie in arrays of planar strips forming a pattern 16 on the top side of the board 10. The conductive patterns 16 may be included on either one, or both, of the faces of the board 10. Contact receiving apertures 18 are formed in the board and, in most cases, are positioned in and electrically connected to certain areas of the pattern 16. The apertures 18 are generally plated through with conductive material 14 and referred to as plated through holes, since that phraseology accurately depicts the conventional manner of fabrication. Around each aperture 18, the circuit pattern 16 includes an annular ring, or pad 19, for facilitating secure electrical and mechanical interconnection with the conductive sides of said aperture. The improvement in the board 10 is comprised of the coating 20 covering the entire exposed surface area of the circuitry material 14, both on the top and bottom surfaces of the mounting substrate 12 and within the plated through holes 18 formed therethrough.

Figure 1:
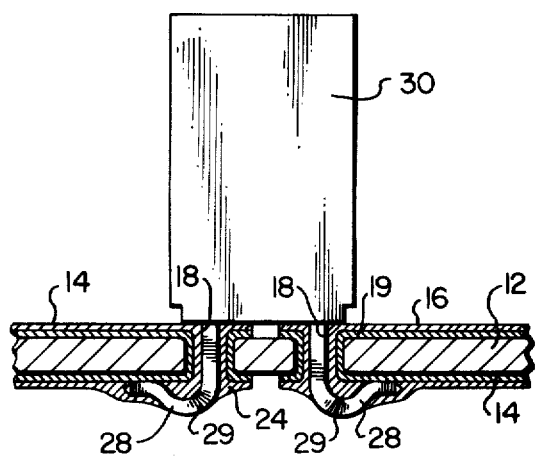
FIG. 1 is a front elevational, cross-sectional view of an electrical connector of one prior art variety, illustrating the utilization of a solder interconnection between the contact and mounting substrate.

Referring now to FIG. 1, one prior art construction of a printed circuit board and electrical connector may be seen for purposes of illustrating the novelty and advantages of the present invention. A mounting substrate 12, having a pattern of circuitry 16 similar to that of FIG. 3, is shown in cross section. Plated through holes 18 are provided with side walls of conductive material 14 which are covered with solder 24. The solder 24 may be seen to fill the hole 18 around contact 28 which extends therethrough. The contact is crimped in lower portion 29 and brought to bear against the bottom surface of the mounting substrate 12. The solder 24 encapsulates and solidifies this crimped configuration through a bond to the circuitry 14, not only around pad 19, but across the entire length of the circuit pattern 16. It may thus be seen that solder in this particular prior art application serves as an environmental coating for conductive material 14 and as a structural bonding agent for rigidly securing the desired contact configuration in the plated through holes 18. An insulator 30 which houses the contact 28 is shown atop the mounting substrate 12 and, in this particular configuration, is of the type generally not removable from around the contacts. Such a connector 30 is commonly referred to as a discrete connector. The obvious disadvantage of discrete connectors is repairability. The solder 24 must be molten to attain the configuration shown herein, and therefore, the heat must be reapplied to the crimped area 29 of the contact 28 to free it from its solder bond for connector repair.

Figure 2:
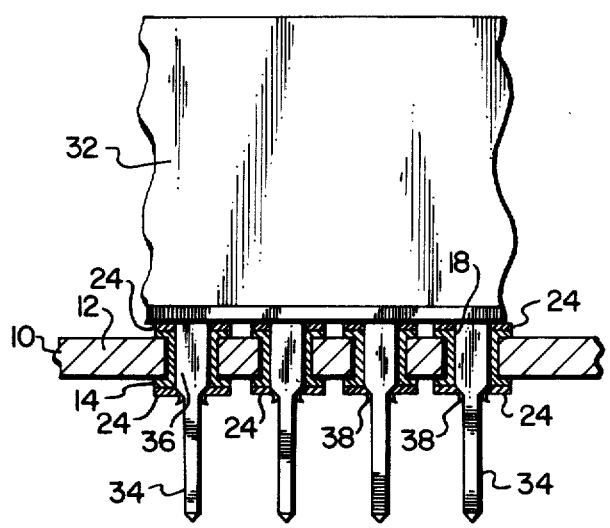
FIG. 2 is a front elevational, cross-sectional view of an electrical connector of another prior art variety, illustrating the utilization of a press fit interconnection between the contact and mounting substrate.

Referring now to FIG. 2, a more advanced prior art connector configuration is illustrated. A connector 32 of the "press fit" variety is provided with a plurality of contacts 34 having press fit regions 36 formed therealong. Solder 24 is present in this configuration, but in a distinctly different capacity from that of FIG. 1. Although the solder 24 is applied to the conductive material 14 inside and outside of the plated through holes 18, it is generally not reflowed to secure contact engagement in said holes. Press fit technology has been shown to provide a secure electrical and mechanical engagement between contacts and contact receiving apertures by force fitting the press fit region 36 of the contacts into the aperture of the mounting substrate 12. The malleable solder 24 is penetrated and deformed by the press fit portion 36 which engages and preferably deforms the circuitry material 14 therein. This configuration provides optimum electrical interconnection and structural rigidity. For such a result the press fit portions 36 are preferably provided with angular edge portions, as will be discussed in more detail below.

The connector assembly of FIG. 2 facilitates application of a removable insulative housing and the resultant repairability of individual contacts 34 facilitated thereby. Since solder 24 is not used to bond or structurally secure the contact 34 in the hole 18, the subject contact can be removed by application of a longitudinal push out force which is greater than the interference engagement forces. Similarly, replacement contacts can be installed with equal ease. In this manner, heating the solder in the plated through hole 18 or on the circuit pad 19 is not necessary. There are, however, certain disadvantages inherent in this assembly. Solder 24 must still be applied in a molten state to the printed circuit board 10, in order to coat the circuitry material 14 within the holes 18 and on the circuitry pads 19 therearound. The remaining circuitry 16 may be either coated with solder 24 or a solder mask of epoxy. Such a solder mask may be of the type conventionally utilized to hermetically seal printed circuit boards after assembly, which are commonly referred to as "conformal" coatings. Therein, two materials and two coating stages may be necessary to prepare the printed circuit board of this particular embodiment for assembly. In either event, the printed circuit board must be exposed to the high temperature of solder application. Moreover, the press fitting of contacts 34 into the holes 18 may cause portions of the solder coating to be squeezed out in barbs 38, commonly referred to as "bananas" in the electrical connector industry. The solder bananas 38 are electrically conductive, are potentially present in most prior art press fitting applications, and pose the threat of shorting out sections of adjacent circuitry.

Figure 4:
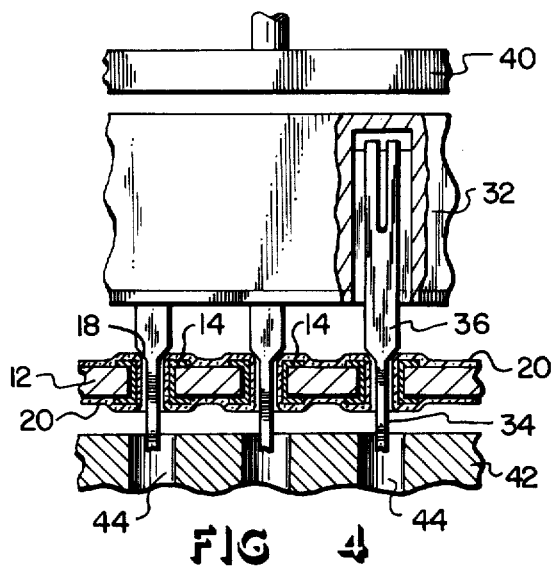
FIG. 4 is a front elevational cross-sectional view of an electrical connector comprising the coated printed circuit board of FIG. 3 and illustrating one stage of construction thereof in accordance with the principles of the present invention.

Referring now to FIG. 4, there is shown the utilization of the improved printed circuit board 10 of the present invention, as an element in the assembly of a solderless electrical connector. The board 10 has been fabricated, as shown in FIG. 3, with a thin layer of dielectric material covering all conductive material 14 in a manner and configuration to be discussed below. Contacts 34, having press fit portions 36, are aligned above an array of the contact receiving apertures 18 for assembly. The shanks 36 are comprised of at least two angular edge portions which are adapted for piercing and penetrating the insulative coating 20 lining the plated through holes 18. A backup plate 42 is provided beneath the mounting substrate 12 and is constructed with plurality of apertures 44 therein for receiving the tails of the contacts 34 during assembly. A load bearing plate 40 is provided for bearing against the top of the insulative housing 32 holding the contacts therein. If the housing 32 is not of the type adapted for withstanding the press fit insertion forces and serving as a seating tool, then a separate holding fixture and seating tool must be provided. As insertion forces are applied by the plate 40 to the contacts 34, the shank portions 36 are forced into the aperture 18 in interference engagement for effecting a tight electrical and mechanical assembly.

Figure 5:
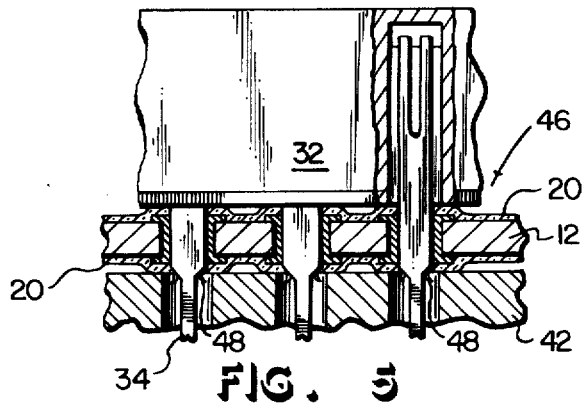
FIG. 5 is a front elevational, cross-sectional view of the electrical connector of FIG. 4 in a second stage of construction and illustrating the penetration of the insulative coating in the plated through holes during press fitting of contact terminals therein.

As shown in FIG. 5, the contacts 34 are press fitted into the mounting substrate 12 to form a connector assembly 46 similar to that shown in FIG. 2. The most obvious advance of the present invention over the prior art structure is the total absence of conductive solder 24 and the novel presence of the insulative coating 20 within the apertures 18. It may be seen that barbs, or bananas 48, are illustrated at the base of the plated through holes 18. The bananas 48 are sometimes formed during press fit insertion of the contact 34 in the same manner as that described above for solder bananas 38. This aspect again presents itself because the contact 34 in each instance penetrates, deforms and displaces the layer of material lining the side walls of the plated through hole 18. However, in the present invention, the bananas 48 are comprised of the dielectric material forming the coating 20 and is therefore not conductive and does not pose a threat of shorting out any element of the connector 46 or adjacent circuitry. Since the solder 24 only serves as an environmental coating as viewed in FIG. 2, its absence in FIG. 5 may be seen to have no effect on connector performance or reliability.

Referring now to FIG. 6, there is shown in more detail an enlarged, top plan view of the contact receiving aperture 18, of the printed circuit board 10 of FIG. 3, which includes a lining of insulative coating 20 therearound. The coating 20 is preferably adhered to the walls of the hole 18 in a uniform configuration and thickness. A thickness on the order of one-half to one and one-half mils has been found satisfactory, although thicknesses in the range of one-quarter to two mils have also been shown to be effective. The thickness, is however, of critical importance since it must be pierced to establish an electrical interconnection. The methods of application of the coating 20 must thus be controlled, as must the material properties of the coating 20. Both dipping and spraying may effectively encapsulate the board 10, but neither application has been proven effective in coating the apertures 18 in a satisfactory manner. For example, the average diameter of a hole 18 adapted for the receipt of a conventional press fit contact is 0.040 inches. Such a small aperture is easily filled and clogged with viscous epoxies, and the like, rather than uniformly received along the side walls thereof. Therefore, both the viscosity and method of application of the coating 20 are important criteria. An uncontrolled application of epoxy to the apertures of a substrate 12 can result in both electrical and mechanical interconnection failure. It has been shown that a coating thickness in the apertures 18 greater than two mils can be detrimental to proper press fitting of contacts therein.

One method of effective application of a suitable coating 20 incorporates the utilization of a mixed epoxy, such as "HYSOL" brand "PC-17", having a viscosity in the range of 200 to 600 cps, measured at 25° C. It is preferable for the epoxy to be of the variety subject to being thinned by conventional solvents to control said viscosity range. The epoxy is applied to the subject mounting substrate 12 by dipping it first to encapsulate all surfaces and then withdrawing the substrate to allow gravity and surface tension to cause the epoxy to evenly coat the top and bottom surfaces of the board 10. By further controlling the viscosity of the epoxy, a film thickness on the order of one and one-half to three mils can be achieved across the top and bottom surfaces of the board. Surface tension will, however, often prevent suitable coating of the side walls of the plated through holes 18, even with epoxies having very low viscosities. To alleviate this condition of "clogged" and improperly coated holes it has been discovered that "drawing" air through apertures 18 will cause the low viscosity epoxy to coat the side walls thereof with a uniform thickness. The "drawing" of air through the board 10 may be accomplished by imparting a pressure differential thereacross through the creation of a partial vacuum on one side of the board. The technique of "blowing" air against the face of the board to create a pressure differential has also been shown to be satisfactory with epoxies of low viscosity. However, blown air has been shown to disturb the even coating of epoxy applied to the board by dipping and at times may cause the raised portions thereof, generally encapsulating the circuitry pattern 16, to migrate onto the surface of the substrate 12.

Referring now to FIGS. 8A through 8C, there is illustrated one method of applying a coating 20 in accordance with the principles of the present invention. A substrate 12 is fabricated to the construction stage wherein the proper circuitry pattern 16 and plated through holes 18 are formed. In FIG. 8A the board is immersed in a suitable epoxy, preferably having a viscosity of 200 to 600 cps, and pot life of two to three days. In FIG. 8B the board is allowed to drain preferably in a horizontal configuration, wherein a generally uniform thickness of epoxy is achieved thereacross through self-leveling of the epoxy. In FIG. 8C, the coated board is mounted across a chamber 60 while the epoxy is still in a liquid phase wherein a partial vacuum can be drawn. Reducing the pressure in chamber 60 on the order of 3 to 5 psi will cause air to be drawn from above the board 10 through holes 18. The drawn air, in conjunction with the surface tension of the epoxy, causes the epoxy to line the side walls thereof. With a viscosity range on the order of 200 to 600 cps and a chamber pressure on the order of 3 psi below ambient, a uniform wall coating thickness of about one-half mil has been achieved.

It may be seen that other methods may be utilized to both apply the subject epoxy and impart a uniform coating thickness to the apertures 18. For example, the utilization of certain para-xylylene copolymers has been found satisfactory when applied to printed circuit boards 10 by a condensation process. In such instances the copolymer is produced in a vapor which is induced to condense on exposed surfaces such as boards 10 immersed in the polymerization zone, or the vapor. The result is a conformal coating of uniform thickness, even in the apertures 18, when polymerization parameters are closely maintained. The principal disadvantage is the cost and loss of control of aperture thickness made possible with drawn air techniques.

Referring now to FIG. 7, there is shown a contact 34 in press fit interengagement with the aperture 18 of FIG. 6. The press fit region, or shank 36 of the contact 34 is shown engaging the plated side walls 14 of the aperture 18 in a cross sectional configuration typical of conventional press fit applications utilizing solid pins. The shank 36 is a rectangular solid including four angular edge portions 50, 52, 54 and 56 which pierce and deform the coating 20 lining the aperture 18. It may be seen that portions of the coating 20 adjacent the edge portions of the shank 36 may be deformed and moved outwardly into ridge portions 58 as the contact 34 is inserted. A similar material displacement is observed in press fitting contacts in solder coated, plated through holes 18, wherein the solder is displaced into ridges. The material displacement of either solder or epoxy only secondarily effects the electrical and mechanical engagement between the contact 34 and board 10. The primary structural and electrical interface is between the edge portions 52, 54, 56 and 58 and the plated through material 14 lining the side walls of aperture 18. It is the conductive lining 14 which is preferably engaged and deformed to impart a rigid interconnection. Although it has been conventionally assumed that only a conductive substance such as solder should interface between the contact shank 36 and conductive plating 14, it has been recognized that direct contact between said shank and plating is preferable. It has also been shown that the metallurgical properties of solder, such as the manifestation of "creep," can be detrimental to the reliability of a connector not incorporating said direct shank to plating contact. For this reason the methods and apparatus of the present invention have been proven to be effective in the fabrication and assembly of electrical connectors despite the divergence from the conventional solder norm.

Having described the invention in connection with certain specific embodiments thereof, it is to be understood that further modifications may now suggest themselves to those skilled in the art and it is intended to cover such modifications as fall within the scope of the appended claims.

What is claimed is:

1. In a printed circuit board of the type comprising an insulative mounting substrate having conductive circuitry formed thereon and plated through holes which are usually coated with solder, constructed therein, which plated through holes are adapted for receiving electrically connecting and rigidly mounting press fit contact terminals in tight frictional engagement therein, said contact terminals having a cross sectional size greater than the inside diameter of said plated through hole, the improvement comprising insulative coating masking the exposed surfaces of the conductive circuitry and plating of said plated through holes in a thin film laminar configuration therein replacing the presence of solder upon said circuirty and within said plated through holes and adapted for penetration in the plated through holes by direct press fit insertion of the contact terminals therein for effecting a tight electrical and rigid mechanical interengagement between the conductive circuitry within the plated through holes and the contact terminal.

2. The improved printed circuit board as set forth in claim 1 wherein the insulative coating is comprised of a two part epoxy.

3. The improved printed circuit board as set forth in claim 2 wherein the epoxy has an application viscosity in the range of 200 to 600 cps.

4. The improved printed circuit board as set forth in claim 1 wherein the thin film laminar configuration covering the conductive circuitry formed on the board is comprised of a thickness in the range of one to three mils.

5. The improved printed circuit board as set forth in claim 1 wherein the thin film laminar configuration covering the conductive circuitry plated through the holes is comprised of a thickness in the range of one-half to one and one-half mils.

6. The improved printed circuit board as set forth in claim 1 wherein the thin film laminar configuration covering the conductive circuitry forms a generally infundibular orifice around and through each plated through hole.

7. An improved side wall construction of a press fit contact receiving aperture of the plated through type comprising a hole in and through an insulative printed circuit board substrate having conductive traces formed thereon, which aperture is plated through with a first layer of conductive material directly upon the insulative substrate and in electrical contact with the conductive trace adjacent said hole and being adapted for receiving and rigidly mounting a contact having an angular edge portion in direct press fit engagement therein, with a coating of solder therethrough and upon said conductive traces wherein the improvement comprises a pierceable insulative coating masking the conductive traces and the first layer of plated through conductive material lining said aperture, in place of the solder said conductive material forming a cylindrical, electrically conductive coating therearound of a diameter less than the largest cross-sectional width of the angular edge portion of the contact, wherein direct insertion of the contact into the coated aperture pierces said coating and deforms said conductive coating to effect electrical and mechanical engagement with said side walls of said aperture and to rigidly mount the contact into the aperture in the insulative printed circuit board.

8. The improved side wall construction of a contact receiving aperture as set forth in claim 7 wherein the insulative coating is comprised of a two part epoxy.

9. The improved side wall construction of a contact receiving aperture as set forth in claim 8 wherein the epoxy has an application viscosity in the range of 200 to 600 cps.

10. The improved side wall construction of a contact receiving aperture as set forth in claim 7 wherein the insulative coating within the aperture extends outwardly thereof onto the surface of the mounting substrate and masks the conductive traces formed thereon.

11. The improved side wall construction of a contact receiving aperture as set forth in claim 10 wherein the insulative coating forms a generally infundibular orifice around and through said aperture.

12. The improved side wall construction of a contact receiving aperture as set forth in claim 10 wherein the insulative coating forms a thin film laminar configuration covering the conductive circuitry on the surface of the mounting substrate in a thickness in the range of one to three mils.

13. The improved side wall construction of a contact receiving aperture as set forth in claim 10 wherein the insulative coating within said aperture is comprised of a thickness in the range of one-half to one and one-half mils.

14. A solderless electrical connector comprising:
a sheet of insulative printed circuit board material having a pattern of conductive material formed on at least one surface thereof and holes extending through the insulative material and portions of the pattern of conductive material, said holes being plated through directly upon the insulative printed circuit board with a first layer of conductive material which is in electrical contact with the conductive pattern adjacent said holes and which plated through holes are conventionally coated with solder;
a layer of insulative coating adhered directly to and covering the exposed surfaces of the pattern of conductive material on the surface of the printed circuit board and the exposed surfaces of the conductive material within said plated through holes in place of solder for sealing said conductive material from environmental exposure; and
a conductive contact having a cross sectional size greater than the inside diameter of the plated through hole and rigidly mounted in said printed circuit board by having an edge portion of the contact directly press fitted through a plated through hole in said printed circuit board with said edge extending through and piercing the insulative coating within the plated through hole and deforming it away from the conductive material thereunder to electrically contact and frictionally engage the conductive material on the walls of said hole.

15. An electrical connector as set forth in claim 14 wherein the portion of said conductive contacts press fitted into the plated hole includes an angular edge which engages the conductive material beneath said insulative coating to deform the conductive material away from said edge and form a tight fit therewith for structural support thereof.

16. An electrical connector as set forth in claim 15 wherein the portion of said conductive contacts press fitted into the plated holes is rectangular in cross section with four angular edges.

17. An electrical connector as set forth in claim 14 wherein the first layer of conductive material within said holes is comprised of copper plating.

18. An electrical connector as set forth in claim 14 wherein the insulative coating is a two part epoxy.

19. An electrical connector as set forth in claim 18 wherein the epoxy has an application viscosity in the range of 200 to 600 cps.

20. An electrical connector as set forth in claim 14 wherein the insulative coating covering the circuitry on the surface of the sheet of insulative material is adhered thereto in a thin film configuration comprised of a thickness in the range of one to three mils.

21. An electrical connector as set forth in claim 14 wherein the insulative coating is adhered to the first layer conductive material within said holes in a thin film configuration comprised of a thickness in the range of one-half to one and one-half mils.

22. An electrical connector as set forth in claim 14 wherein the insulative coating covering the circuitry on the surface of the insulative material extends into the plated through holes in a tapered configuration comprising a generally infundibular orifice around and through said holes.

23. A solderless, press fit electrical connector assembly comprising:
an insulative printed circuit board mounting substrate having press fit contact receiving apertures formed therein;
a pattern of conductive material formed upon at least one surface of said printed circuit board and electrically engaging conductive material extending into and through certain ones of said contact receiving apertures to line the walls thereof and comprise plated through holes therein which plated through holes are conventionally coated with solder;
a layer of insulative coating adhered to the exposed surfaces of the conductive material on the substrate and in said plated through holes in a thin film configuration replacing the presence of solder on the pattern of conductive material and in the plated through holes;
an insulative housing having a plurality of contact receiving sleeves formed therethrough in spaced alignment with said plated through apertures in said insulative printed circuit board mounting substrate, said housing being removable from around contacts received therein when said contacts are rigidly secured in said insulative mounting substrate; and
conductive contacts received into said sleeves of said insulative housing, said contacts having a press fit shank portion having an edge portion with a cross sectional size greater than the inside diameter of the plated through holes and extending downwardly from said insulative housing directly through said plated through holes in rigid press fit engagement, said edge portion penetrating said insulative coating and deforming it away from the conductive material thereunder to electrically contact and frictionally engage the conductive material on the walls of said holes for rigidly securing said contacts therein.

24. A solderless electrical connector as set forth in claim 23 wherein the portion of said conductive contact press fitted into said plated through hole includes an angular edge which engages the conductive material beneath said insulative coating to deform the conductive material away from said edge and form a tight fit therewith.

25. A solderless electrical connector as set forth in claim 24 wherein the portion of said conductive contact press fitted into the plated through hole is rectangular in cross section with four angular edges.

26. A solderless electrical connector as set forth in claim 23 wherein the conductive material within said plated through holes is comprised of copper.

27. A solderless electrical connector as set forth in claim 23 wherein the insulative coating is a two part epoxy.

28. A solderless electrical connector as set forth in claim 27 wherein the epoxy has an application viscosity in the range of 200 to 600 cps.

29. A solderless electrical connector as set forth in claim 23 wherein the insulative coating covering the surface of the conductive material on the mounting substrate is adhered thereto in a thin film configuration comprised of a thickness in the range of one to three mils.

30. A solderless electrical connector as set forth in claim 23 wherein the insulative coating is adhered to the conductive material within said plated through holes in a thin film configuration comprised of a thickness in the range of one-half to one and one-half mils.

31. A solderless electrical connector as set forth in claim 23 wherein the insulative coating adhered to the surface of the conductive material in the mounting substrate extends into the plated through holes in a tapered configuration comprising a generally infundibular orifice around and through said holes.

* * * * *